(12) United States Patent
Han et al.

(10) Patent No.: US 11,569,176 B2
(45) Date of Patent: Jan. 31, 2023

(54) SEMICONDUCTOR DEVICE AND METHOD OF MANUFACTURING THEREOF

(71) Applicant: Amkor Technology, Inc., Tempe, AZ (US)

(72) Inventors: Yi Seul Han, Incheon (KR); Tae Yong Lee, Goyang-si (KR); Ji Yeon Ryu, Seoul (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 15/465,307

(22) Filed: Mar. 21, 2017

(65) Prior Publication Data

US 2018/0277485 A1 Sep. 27, 2018

(51) Int. Cl.
*H01L 23/538* (2006.01)
*H01L 23/00* (2006.01)
(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/56* (2013.01); *H01L 21/568* (2013.01); *H01L 23/5383* (2013.01); *H01L 23/5386* (2013.01); *H01L 24/16* (2013.01); *H01L 23/3128* (2013.01); *H01L 23/49816* (2013.01); *H01L 23/50* (2013.01); *H01L 23/5384* (2013.01); *H01L 2224/16225* (2013.01); *H01L 2224/16265* (2013.01); *H01L 2924/15311* (2013.01); *H01L 2924/181* (2013.01);
(Continued)

(58) Field of Classification Search
CPC ............ H01L 23/5389; H01L 23/3114; H01L 21/4857; H01L 21/56; H01L 21/563; H01L 21/568; H01L 21/4853; H01L 21/486; H01L 23/5383; H01L 23/5384; H01L 23/5386; H01L 24/16
See application file for complete search history.

(56) References Cited

U.S. PATENT DOCUMENTS 8,970,023 B2 * 3/2015 Chou .................. H01L 23/3135
                                                                 438/109
9,385,095 B2 * 7/2016 Jeng .................... H01L 23/3128
(Continued)

FOREIGN PATENT DOCUMENTS

JP      2010219477 A      9/2010
JP      2014096547 A      5/2014
(Continued)

OTHER PUBLICATIONS

Search Report for International Application No. TW 106118264, dated Jul. 19, 2020.
(Continued)

*Primary Examiner* — Matthew E Warren
(74) *Attorney, Agent, or Firm* — McAndrews, Held & Malloy, Ltd.

(57) ABSTRACT

A semiconductor device and a method of manufacturing a semiconductor device. As a non-limiting example, various aspects of this disclosure provide a semiconductor device comprising multiple encapsulating layers and multiple signal distribution structures, and a method of manufacturing thereof.

26 Claims, 8 Drawing Sheets

(51) Int. Cl.
  *H01L 21/48* (2006.01)
  *H01L 21/56* (2006.01)
  *H01L 23/31* (2006.01)
  *H01L 23/498* (2006.01)
  *H01L 23/50* (2006.01)

(52) U.S. Cl.
  CPC ............. *H01L 2924/19011* (2013.01); *H01L 2924/19041* (2013.01); *H01L 2924/19042* (2013.01); *H01L 2924/19043* (2013.01); *H01L 2924/19104* (2013.01)

(56) References Cited

U.S. PATENT DOCUMENTS

| | | | | |
|---|---|---|---|---|
| 9,970,023 | B2* | 5/2018 | Hosemans | C07K 14/415 |
| 2005/0136635 | A1* | 6/2005 | Savastiouk | H01L 23/5384 |
| | | | | 257/E23.172 |
| 2016/0260684 | A1* | 9/2016 | Zhai | H01L 25/0652 |
| 2017/0069564 | A1* | 3/2017 | Kwon | H01L 25/0657 |
| 2017/0077022 | A1* | 3/2017 | Scanlan | H01L 21/568 |
| 2017/0133351 | A1* | 5/2017 | Su | H01L 21/6835 |
| 2017/0301650 | A1* | 10/2017 | Yu | H01L 21/02164 |
| 2017/0317053 | A1* | 11/2017 | Hung | H01L 25/0652 |
| 2018/0033708 | A1* | 2/2018 | Khim | H01L 24/09 |
| 2018/0076179 | A1* | 3/2018 | Hsu | H01L 24/14 |
| 2018/0226349 | A1* | 8/2018 | Yu | H01L 23/5389 |
| 2018/0374820 | A1* | 12/2018 | Ko | H01L 23/49838 |
| 2019/0006317 | A1* | 1/2019 | Yu | H01L 24/81 |

FOREIGN PATENT DOCUMENTS

| | | |
|---|---|---|
| KR | 1020140099806 A | 8/2014 |
| TW | 201426977 A | 7/2014 |
| TW | 201431011 A | 8/2014 |

OTHER PUBLICATIONS

International Search Report of TW10611824 dated Mar. 19, 2021, 11 pages.
Taiwanese Office Action for TW106118264, dated Nov. 9, 2021, 19 pages.
Korean Office Action for KR10-2017-0080370, dated Oct. 16, 2021, 15 pages.
Taiwanese Office Action for TW106118264, dated Mar. 1, 2022, 22 pages.

* cited by examiner

SEMICONDUCTOR DEVICE AND METHOD OF MANUFACTURING THEREOF

BACKGROUND

Present semiconductor devices and methods for manufacturing semiconductor devices are inadequate, for example resulting in manufacturing processes that are too time-consuming and/or too costly, resulting in semiconductor packages with unreliable connections and/or interconnection structures having suboptimal dimensions, etc. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
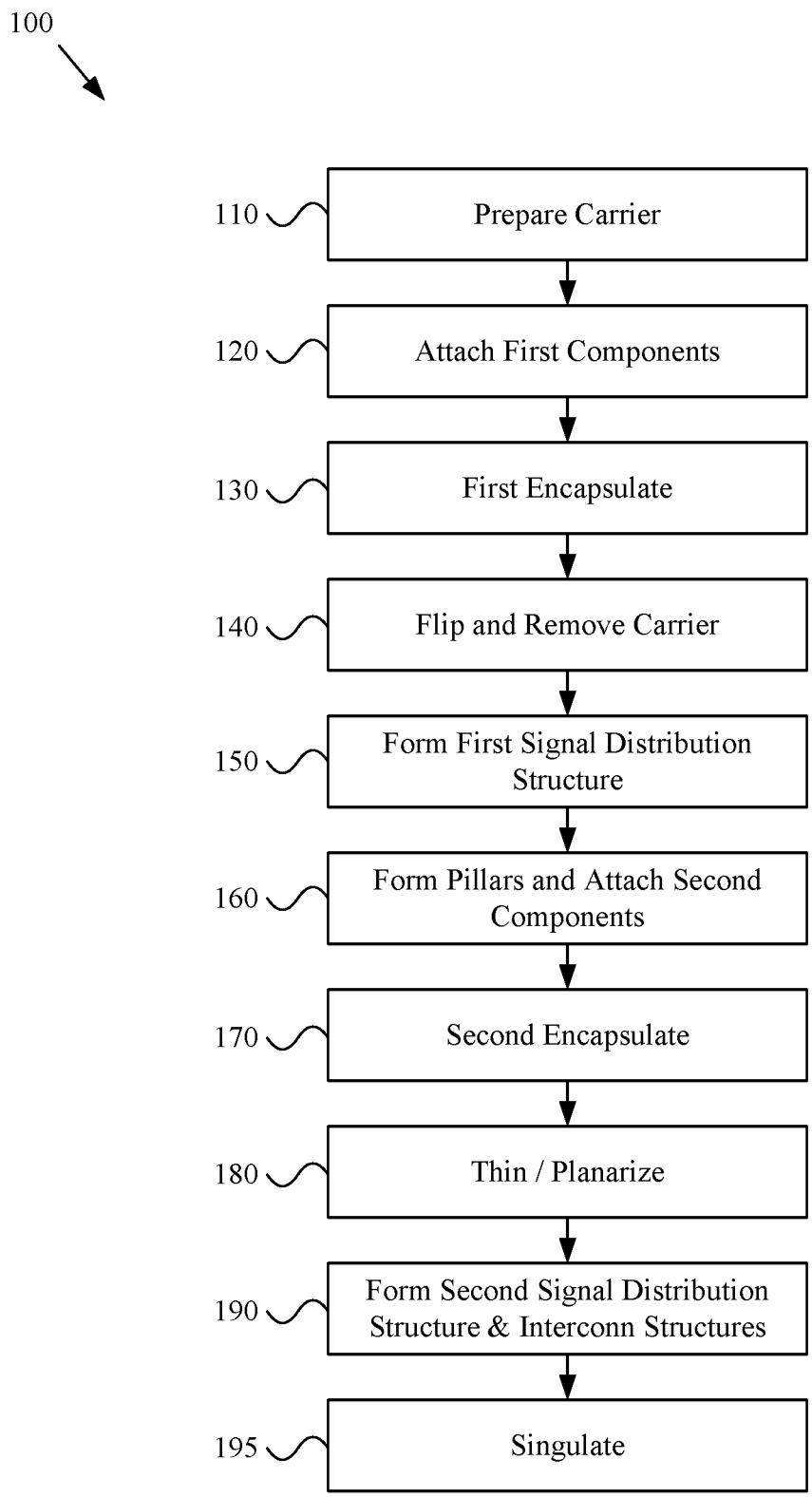
FIG. 1 shows a flow diagram of an example method of manufacturing a semiconductor device, in accordance with various aspects of the present disclosure.

Various aspects of this disclosure provide a semiconductor device and a method of manufacturing a semiconductor device. As a non-limiting example, various aspects of this disclosure provide a semiconductor device comprising multiple encapsulating layers and multiple signal distribution structures, and a method of manufacturing thereof.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated. Additionally, in the drawings, like reference numerals may refer to like elements throughout the discussion.

In recent years, portable electronic products, such as mobile phones or portable media players (PMPs), have been continuously required to be small, lightweight, and cost-effective while having high functionality. To meet these requirements, semiconductor packages mounted on the portable electronic products are developing into innovative, cost-effective three-dimensional (3D) packages.

Accordingly, wafer level chip scale packages, chip size packages, and a chip stacked packages, among other package types, manufactured to have nearly the same size or thickness as that of a chip, are being developed, and examples of such stack type packages include system in package (SIP), multi-chip package (MCP), package-on-package (POP), etc.

Various aspects of the present disclosure provide a semiconductor device, and method of manufacturing thereof, that comprises: a first signal distribution structure (SDS) having a top SDS side, a bottom SDS side, and a plurality of lateral SDS sides, wherein the first SDS comprises a first dielectric layer and a first conductive layer; a first electronic component coupled to the top SDS side; a first encapsulating material that covers at least a portion of the top SDS side and at least a portion of the first electronic component; a semiconductor die coupled to the bottom SDS side and positioned directly below the first electronic component; a plurality of conductive pillars coupled to the bottom SDS side and positioned laterally around the semiconductor die; and a second encapsulating material that covers at least a portion of the bottom SDS side, at least a portion of the semiconductor die, and at least a portion of the conductive pillars.

In various example implementations, a bottom side of each of the conductive pillars and a bottom side of the semiconductor die may be exposed from the second encapsulating material at a bottom side of the second encapsulating material; and the bottom side of each of the conductive pillars, the bottom side of the semiconductor die, and the bottom side of the second encapsulating material may be coplanar. In various example implementations, the device may comprise a lower dielectric layer on a bottom side of the second encapsulating material, where the lower dielectric layer comprises a plurality of apertures, each of the apertures exposing a respective one of the conductive pillars through the lower dielectric layer; and may comprise a plurality of conductive balls, where each of the conductive balls is electrically connected to a respective one of the conductive pillars through a respective one of the apertures. In various example implementations, a top side of the first electronic component may be covered by the first encapsulating material, and a bottom side of the semiconductor die might not be covered by the second encapsulating material. In various example implementations, the device may comprise a second signal distribution structure (SDS) on a bottom side of the second encapsulating material; and a plurality of conductive balls coupled to a bottom side of the second SDS and positioned directly below the semiconductor die, and wherein the second SDS electrically connects each of the plurality of conductive balls to a respective one of the conductive pillars. Additionally, in various example implementations, at least one of the lateral SDS sides may be coplanar with a respective lateral side of the first encapsulating material, a respective lateral side of the second encapsulating material, and a respective lateral side of the second SDS.

Various aspects of the present disclosure provide a semiconductor device, and method of manufacturing thereof, that comprises: a first signal distribution structure (SDS) having a top first SDS side, a bottom first SDS side, and a plurality of lateral first SDS sides that extend between the top first SDS side and the bottom first SDS side; a first electronic component coupled to the top first SDS side; a first encapsulating material that covers at least a portion of the top first SDS side and at least a portion of the first electronic component; a second electronic component coupled to the bottom first SDS side and positioned below the first electronic component; conductive pillars coupled to the bottom first SDS side; a second encapsulating material that covers at least a portion of the bottom first SDS side, at least a portion of the second electronic component, and at least a portion of the conductive pillars; and a second signal distribution structure (SDS) having a top second SDS side, a bottom second SDS side, and a plurality of lateral second SDS sides that extend between the top second SDS side and the bottom second SDS side.

In various example implementations, a bottom side of each of the conductive pillars and a bottom side of the second electronic component (e.g., a semiconductor die) may be exposed from the second encapsulating material at a bottom side of the second encapsulating material, for example wherein the bottom side of each of the conductive pillars, the bottom side of the second electronic component, and the bottom side of the second encapsulating material are coplanar. In various example implementations, a top side of the first electronic component may be covered by the first encapsulating material, and a bottom side of the second electronic component might be exposed from the second encapsulating material. In various example implementations, the device may comprise a plurality of conductive balls coupled to the bottom second SDS side and positioned directly below the second electronic component, and wherein the second SDS electrically connects each of the plurality of conductive balls to a respective one of the conductive pillars; and a second plurality of conductive balls coupled to the bottom second SDS side and positioned laterally outside a footprint of the second electronic component, and wherein the second SDS electrically connects each of the second plurality of conductive balls to a respective one of the conductive pillars. In various example implementations, one of the lateral first SDS sides may be coplanar with a respective lateral side of the first encapsulating material, a respective lateral side of the second encapsulating material, and a respective one of the lateral second SDS sides; and/or each of the first SDS and second SDS may comprise a plurality of conductive layers and a plurality of dielectric layers.

FIG. 1 shows a flow diagram of an example method of manufacturing a semiconductor device, in accordance with various aspects of the present disclosure. FIGS. 2A-2I show cross-sectional views illustrating various steps of a method of manufacturing a semiconductor device, in accordance with various aspects of the present disclosure. For example, FIGS. 2A-2I may show cross-sectional views of an example semiconductor device during manufacturing in accordance with the example method 100 of FIG. 1. The following discussion will generally refer to FIG. 1 and FIGS. 2A-2I together.

Referring to FIG. 1, the example method 100 of manufacturing a semiconductor device may comprise: (110) preparing a carrier, (120) attaching first components, (130) first encapsulating, (140) flipping and carrier removing, (150) forming a first signal distribution structure, (160) forming pillars and attaching second components, (170) second encapsulating, (180) thinning/planarizing, (190) forming a second signal distribution structure and interconnection structures, and (195) singulating.

Various blocks (or steps, stages, processes, etc.) of the example method 100 illustrated FIG. 1 will be now be described with reference to FIGS. 2A-2I.

Figure 2A:
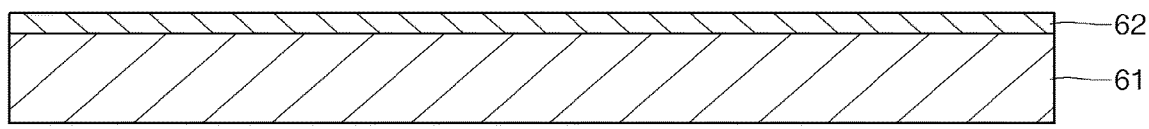
FIGS. 2A-2I show cross-sectional views illustrating various steps of an example method of manufacturing a semiconductor device, in accordance with various aspects of the present disclosure.

Referring to FIG. 1 and the example structure 200a of FIG. 2A, the example method 100 may, at block 110, comprise preparing (or providing, receiving, etc.) a carrier 61. The carrier 61 may comprise any of a variety of characteristics, non-limiting examples of which are provided herein. The carrier 61 may, for example, comprise a carrier for a single semiconductor device (or package) or may, for example, comprise a wafer or panel on which any number of semiconductor devices (or packages) may be formed. The carrier 61 may, for example, comprise a semiconductor wafer or panel. The carrier 61 may also, for example, comprise a glass wafer or panel, a metal wafer or panel, a ceramic wafer or panel, a plastic wafer or panel, etc.

Block 110 may also, for example, comprise forming an adhesive layer 62 on the carrier. The adhesive layer 62 may, for example comprise a layer of adhesive paste, a layer of liquid adhesive, a preformed double-sided adhesive tape or sheet (e.g., a die-attach tape), a printed adhesive, etc. The adhesive layer 62 may, for example, partially or completely cover the top side of the carrier 61. Block 110 may comprise forming the adhesive layer 62 in any of a variety of manners. For example, block 110 may comprise forming the adhesive layer 62 by applying a preformed sheet or film of the adhesive layer 62 to the carrier 61, printing the adhesive layer 62 on the carrier 61, spin-coating the adhesive layer 62 on the carrier 61, dipping the carrier 61 in an adhesive, spraying the adhesive layer 62 on the carrier, etc.

Note that in an example scenario in which the carrier 61 is received with the adhesive layer 62 already applied, block 110 may skip applying the adhesive layer 62. Also note that in an example scenario, the components coupled to the carrier 61 (e.g., at block 120, etc.) may be coated with the adhesive layer 61 (or a portion thereof) prior to applying the components to the carrier 61.

Figure 2B:
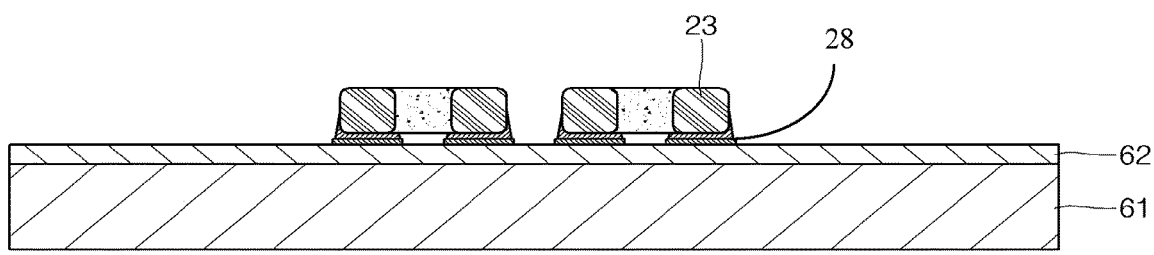

Referring next to FIG. 1 and the example structure 200*b* of FIG. 2B, the example method 100 may, at block 120, comprise coupling (or attaching or forming) one or more first electronic components 23 to the carrier 61. Block 120 may, for example, comprise placing the first electronic components 23 on a top side of the adhesive layer 62 (e.g., the bottom side of the adhesive layer 62 facing the carrier 61).

The one or more first electronic components 23 (or any electronic component discussed herein) may comprise characteristics of any of a variety of types of electronic components. For example, any or all of the first electronic components 23 (or any electronic component discussed herein) may comprise passive electronic components (e.g., resistors, capacitors, inductors, antenna elements, etc.), integrated passive devices (IPDs), etc. In an example scenario in which one or more of the first electronic components 23 comprises an IPD, each of such first electronic components 23 may have a relatively small thickness (e.g., 50 microns or less, etc.).

Also for example, any or all of the first electronic components 23 may comprise active electronic components (e.g., semiconductor dies, transistors, etc.). For example, any or all of the first electronic components 23 may comprise a processor die, microprocessor, microcontroller, co-processor, general purpose processor, application-specific integrated circuit, programmable and/or discrete logic device, memory device, combination thereof, equivalent thereof, etc.

The example first electronic components 23 may, for example, comprise component terminals 28. In an example implementation, the component terminals 28 of the first electronic components 23 may be placed in contact with the adhesive layer 62. In various example scenarios, the component terminals 28 (e.g., all or portions of lateral sides thereof) may be embedded in the adhesive layer 62. Block 120 may comprise placing the one or more first electronic components 23 in any of a variety of manners (e.g., utilizing automated pick-and-place systems, manually placing, performing any combination of automated and manual placement, etc.).

Figure 2C:
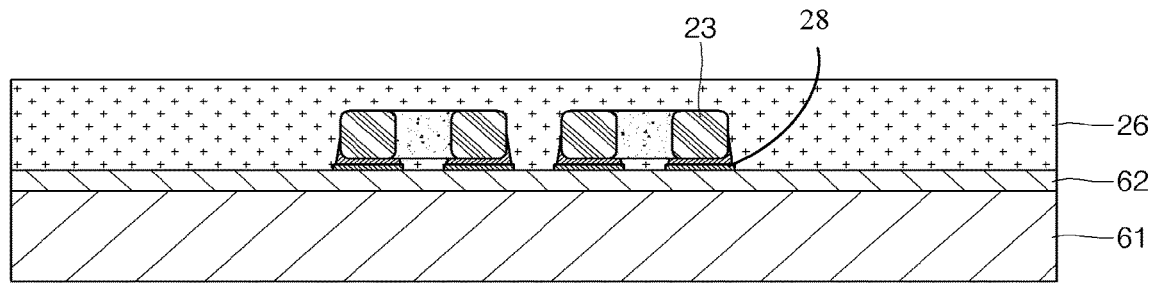

Referring next to FIG. 1 and the example structure 200*c* of FIG. 2C, the example method 100 may, at block 130, comprise forming a first encapsulating material. For example, block 130 may comprise covering the top side of the adhesive layer 62 and any or all sides of the first electronic components 23 (e.g., top sides, bottom sides facing the adhesive layer 62 where there is a gap between the component and the adhesive layer 62, lateral sides, etc.) in a first encapsulating material 26. Additionally, the first encapsulating material 26 may cover any portion of the conductive terminals 28 that is not already covered (e.g., not already covered by the adhesive layer 62, the other portions of the first electronic components 23, etc.). Note that any of the sides of one or more of the first electronic component(s) 23 may be left uncovered by the first encapsulating material 26.

Block 130 may comprise forming the first encapsulating material 26 in any of a variety of manners, non-limiting examples of which are provided herein. For example, block 130 may comprise forming the first encapsulating material 26 utilizing one or more of compression molding, transfer molding, liquid encapsulant molding, vacuum lamination, paste printing, film assisted molding, etc. Also for example, block 130 may comprise forming the first encapsulating material 26 utilizing one or more of spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.

The first encapsulating material 26 may comprise one or more of a variety of encapsulating materials, non-limiting examples of which are provided herein. For example, the first encapsulating material 26 may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). Also for example, the first encapsulating material 26 may comprise any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.).

Note that, as discussed herein with regard to the second encapsulating material formed at block 170, the first encapsulating material 26 may be originally formed to a desired thickness, but may also be thinned (e.g., thinned while still covering the first electronic components 23, thinned to expose a top surface of one or more of the first electronic components 23, etc.).

Figure 2D:
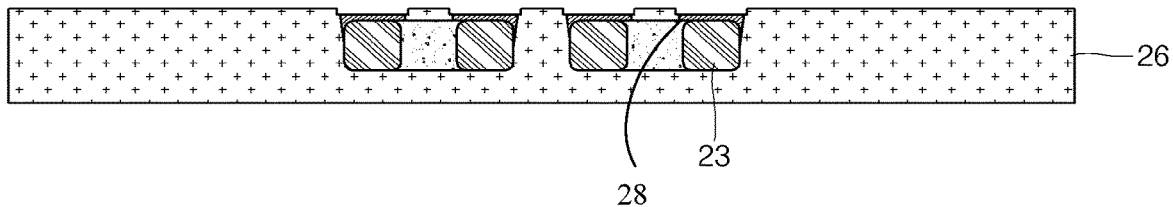

Referring next to FIG. 1 and the example structure 200*d* of FIG. 2D, the example method 100 may, at block 140, comprise flipping (or turning over) the first encapsulated structure 200*c* and removing the carrier 61 and adhesive layer 62. In an example implementation, though not shown in FIG. 2D, a second carrier (or tooling structure) may be coupled to the first encapsulating material 26 (e.g., at a side opposite the carrier 61 and adhesive layer 62, etc.), and then the carrier 61 and adhesive layer 62 may be removed.

Block 140 may comprise removing the carrier 61 and adhesive layer 62 in any of a variety of manners, non-limiting examples of which are provided herein. For example, block 140 may comprise applying energy (e.g., thermal energy, laser energy, etc.) to the adhesive layer 62 and/or the carrier 61 to release the adhesive layer 62. Additionally for example, block 140 may comprise peeling, sheering, and/or pulling the carrier 61 from the first encapsulating material 26 and first electronic components 23. Further for example, block 140 may comprise grinding (or abrading) and/or chemically etching away the carrier 61 and/or adhesive layer 62. Note that in various example scenarios, a portion of the conductive terminals 28 and/or first encapsulating material 26 immediately adjacent to the adhesive layer 62 may also be removed (e.g., planarized, etc.).

Note that the removal of the carrier 61 and the adhesive layer 62 may expose the side of the first encapsulating material 26 that was previously covered by the adhesive layer 62 and carrier 61, and may also expose sides of the component terminals 28 that were previously covered by the adhesive layer 62 and carrier 61 (e.g., for example the sides facing the carrier 61, lateral sides that may have been embedded in the adhesive layer 62, etc.). Note that depending on the geometry of the first electronic components 23 and/or conductive terminals 28, the removal of the carrier 61 and the adhesive layer 62 may also expose portions of the first electronic components 23 in addition to the conductive terminals 28.

Figure 2E:
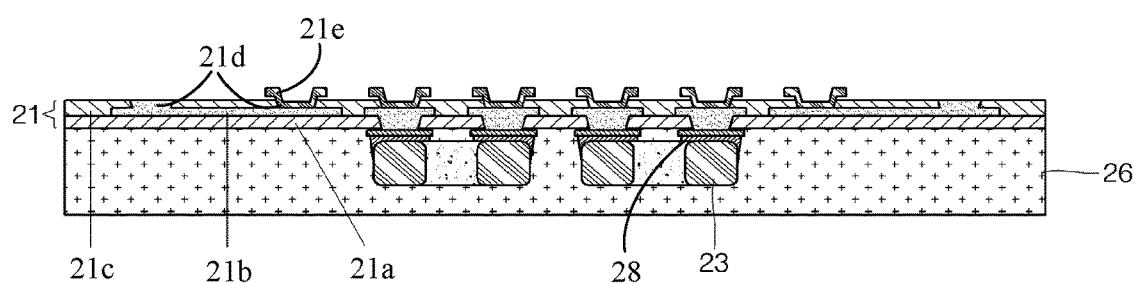

Referring next to FIG. 1 and the example structure 200e of FIG. 2E, the example method 100 may, at block 150, comprise forming a signal distribution structure 21 on the first encapsulating material 26 and on the first electronic components 23 (and/or conductive terminals 28 thereof). Block 150 may comprise forming the signal distribution structure 21 in any of a variety of manners, non-limiting examples of which are provided herein. For example, block 150 may share any or all characteristics with generally analogous blocks (and/or the resulting structures) shown in U.S. patent application Ser. No. 14/823,689, filed on Aug. 11, 2016, and titled "Semiconductor Package and Fabricating Method Thereof," the entirety of which is hereby incorporated herein by reference in its entirety for all purposes.

Block 150 may, for example, comprise forming and patterning one or more dielectric layers and one or more conductive layers to form the signal distribution structure 21. Note that the signal distribution structure 21 may also be referred to as a redistribution layer, a redistribution layer stack, a redistribution structure, an interposer, etc.

Block 150 may, for example, comprise forming the signal distribution structure 21 having any number of dielectric layers and conductive layers (e.g., signal distribution layers, redistribution layers, pad layers, conductive vias, under-bump metallization, land layers, etc.). In an example implementation, block 150 may comprise forming a signal distribution structure 21 comprising a first dielectric layer 21a, a first conductive layer 21b (e.g., a pad or land layer, a trace layer, etc.), a second dielectric layer 21c, a second conductive layer 21d (e.g., a pad or land layer, a trace layer, etc.), and an under bump metallization (UBM) structure (or layer) 21e.

For example, block 150 may comprise forming the first dielectric layer 21a utilizing any one or more of a variety of processes (e.g., spin coating, spray coating, printing, sintering, thermal oxidation, physical vapor deposition (PVD), chemical vapor deposition (CVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

The dielectric layer 21a may comprise one or more layers of any of a variety of dielectric materials, for example inorganic dielectric materials (e.g., $Si_3N_4$, $SiO_2$, SiON, SiN, oxides, nitrides, combinations thereof, equivalents thereof, etc.) and/or organic dielectric materials (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Block 150 may, for example, also comprise patterning the first dielectric layer 21a, for example forming apertures therein that expose various portions of the electronic components 23 discussed herein (e.g., conductive terminals 28, etc.). For example, block 150 may comprise ablating apertures (e.g., utilizing laser ablation, utilizing mechanical ablation, utilizing chemical ablation (or etching), etc.). Also for example, block 150 may comprise originally forming the first dielectric layer 21a (e.g., depositing, etc.) having the desired apertures (e.g., utilizing a masking and/or printing process, etc.).

Block 150 may comprise forming the first conductive layer 21b (e.g., a pad or land layer, a trace layer, etc.) in any of a variety of manners, non-limiting examples of which are provided herein. For example, block 150 may comprise forming the first conductive layer 21b utilizing any one or more of a variety of processes (e.g., electroplating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto. Block 150 may, for example, comprise forming the first conductive layer 21b comprising pads or lands in apertures of the first dielectric layer 21a, for example on top sides of the conductive terminals 28 of the electronic components 23. Block 150 may also, for example, comprise forming traces on the first dielectric layer 21a (and/or in channels formed herein).

As with any of the conductive layers discussed herein, block 150 may comprise forming one or more seed layers as part of the processing of forming the first conductive layer 21b (e.g., prior to electroplating the first conductive layer 21b, etc.). For example, though not shown in FIG. 2E, block 150 may comprise forming one or more seed layers on the top surface of the conductive terminals 28, on aperture sidewalls of the first dielectric layer 21a, on the top surface of the first dielectric layer 21a, etc.

The first conductive layer 21b, which may also be referred to herein as a pad, a via, a trace, a land, a bond pad layer, a conductive layer, a trace layer, a redistribution layer, etc., may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

Block 150 may, for example, comprise forming a second dielectric layer 21c on the first dielectric layer 21a (or portions thereof) and/or on the first conductive layer 21b (or portions thereof). Block 150 may, for example, comprising forming the second dielectric layer 21c in any of a variety of manners, for example any of the manners discussed herein with regard to the first dielectric layer 21a. For example, block 150 may comprise forming the second dielectric layer 21c in the same manner as the first dielectric layer 21a, or in a different manner. The second dielectric layer 21c may, for example, comprise any of the characteristics discussed herein with regard to the first dielectric layer 21a. The second dielectric layer 21c may, for example, be formed of the same dielectric material as the first dielectric layer 21a, or of a different dielectric material.

As with the first dielectric layer 21a, block 150 may comprise patterning the second dielectric layer 21c in any of a variety of manners. For example, block 150 may comprise forming apertures in the second dielectric layer 21c to expose pads, lands, or traces of the first conductive layer 21b, for example for establishing electrical contact with a second conductive layer 21d.

Block 150 may, for example, comprise forming a second conductive layer 21d on the second dielectric layer 21c, in apertures of the second dielectric layer 21c, in and/or on portions of the first conductive layer 21b (or other materials) exposed through apertures of the second dielectric layer 21c, etc. Block 150 may, for example, comprising forming the second conductive layer 21d in any of the manners discussed herein with regard to the first conductive layer 21b. For example, block 150 may comprise forming the second conductive layer 21d in the same manner as the first conductive layer 21b, or in a different manner. The second conductive layer 21d may, for example, comprise any or all of the characteristics discussed herein with regard to the first conductive layer 21b. The second conductive layer 21d may, for example, be formed of the same conductive material as the first conductive layer 21b, or of a different conductive material.

In an example implementation, the second conductive layer 21d (or a portion thereof) may comprise first pads or lands, to which interconnection structures of one or more electronic components may be attached, and second pads or lands, on which conductive pillars (or posts) may be formed. Note that the first pads or lands and the second pads or lands may be the same or may have different respective characteristics (e.g., metallurgy characteristics, geometrical characteristics, etc.).

Note that block 150 may comprise forming the signal distribution structure 21 to have any number of conductive and/or dielectric layers, for example one or more conductive layers, one or more dielectric layers, etc. Also note that the configuration of the signal distribution structure 21 shown in the various figures herein is merely exemplary and not limiting. For example, the signal distribution structure 21 (or conductive layers thereof) may provide electrical paths directly vertically or indirectly (e.g., vertically and horizontally, etc.) through the signal distribution structure 21, for example between the first electronic components 23 and the second electronic components 22 and/or conductive pillars 25 (or other components). Also for example, the signal distribution structure 21 (or conductive layers thereof) may provide lateral (or horizontal) electrical pathways through the signal distribution structure 21, for example between the first electronic components 23 and the second electronic components 22 and/or pillars 25 (or other components).

Block 150 may also, for example, comprise forming an under bump metallization (UBM) structure 21e (or layer) on the second conductive layer 21d and/or on the second dielectric layer 21c (e.g., on portions of the second dielectric layer 21c around a perimeter of apertures in the second dielectric layer 21c through which the second conductive layer 21d is exposed, etc.). For example, block 150 may comprise forming the UBM structure 21e to have one or more metallization layers conducive to the attachment (or formation) of interconnection structures (e.g., conductive balls, conductive pillars or posts, etc.), for example as formed and/or attached at block 160. The UBM structure 21e may, for example, be exposed at the top surface of the signal distribution structure 21 (e.g., as oriented in FIG. 2E). The UBM structure 21e may also be referred to herein as a land or pad.

Block 150 may comprise forming the UBM structure 21e in any of a variety of manners, non-limiting examples of which are provided herein. In an example implementation, block 150 may comprise forming a UBM seed layer of the UBM structure 21e over the second dielectric layer 21c and/or over the portion of the second conductive layer 21d (e.g., a pad or land, a trace, etc.) that is exposed through an aperture in the second dielectric layer 21c. The UBM seed layer may, for example, comprise any of a variety of conductive materials (e.g., copper, gold, silver, metal, etc.). The UBM seed layer may be formed in any of a variety of manners (e.g., sputtering, electroless plating, chemical vapor deposition (CVD), physical vapor deposition (PVD), atomic layer deposition (ALD), plasma vapor deposition, etc.).

Block 150 may, for example, comprise forming a mask (or template) over the UBM seed layer to define a region (or volume) in which one or more additional UBM layers of the UBM structure 21e (and/or the conductive pillars 25 or other interconnection structure) is to be formed. For example, the mask may comprise a photoresist (PR) material or other material, which may be patterned to cover regions other than the region on which the UBM layer(s) (and/or the conductive pillars 25) are to be formed. Block 150 may then, for example, comprise forming one or more UBM layers on the UBM seed layer exposed through the mask. The UBM layer(s) may comprise any of a variety of materials (e.g., titanium, chromium, aluminum, titanium/tungsten, titanium/nickel, copper, alloys thereof, etc.). Block 150 may comprise forming the UBM layer on the UBM seed layer in any of a variety of manners (e.g., electroplating, sputtering, electroless plating, chemical vapor deposition (CVD), physical vapor deposition (PVD), atomic layer deposition (ALD), plasma vapor deposition, etc.).

Note that the UBM structures 21e may or may not be present, for example depending on the interconnection needs. In an example implementation, UBM structures 21e may be formed for interconnection with the second electronic components 22, but not for interconnection with the conductive pillars 25. In another example implementation, UBM structures 21e may be formed for interconnection with the second electronic components 22 and for interconnection with the conductive pillars 25. In such an example implementation, the respective UBM structures 21e for the interconnections with the second electronic components 22 may be different from (e.g., metallurgically different, geometrically different, etc.) the respective UBM structures 21e for the interconnections with the conductive pillars 25 (or such UBM structures 21e may all be the same). Another example implementation might not include UBM structures 21e. Still another example implementation may include UBM structures 21e for the interconnections with the conductive pillars 25, but not for the interconnections with the second components 22. Note that conductive lands or pads may be used instead of the UBM structures 21e or in addition to the UBM structures 21e.

As discussed herein, the signal distribution structure 21 may vertically and/or horizontally route any of the electrical signals of the first electronic components 23, of the second electronic components 22 (to be mounted at block 160), and/or of the conductive pillars (to be formed at block 160). For example, the signal distribution structure 21 may route any of such signals vertically and/or both vertically and horizontally (or laterally).

In general, block 150 may comprise forming a signal distribution structure 21 (or interposer). Accordingly, the scope of the present disclosure should not be limited by characteristics of any particular signal distribution structure or by characteristics of any particular manner of forming such a signal distribution structure.

Figure 2F:
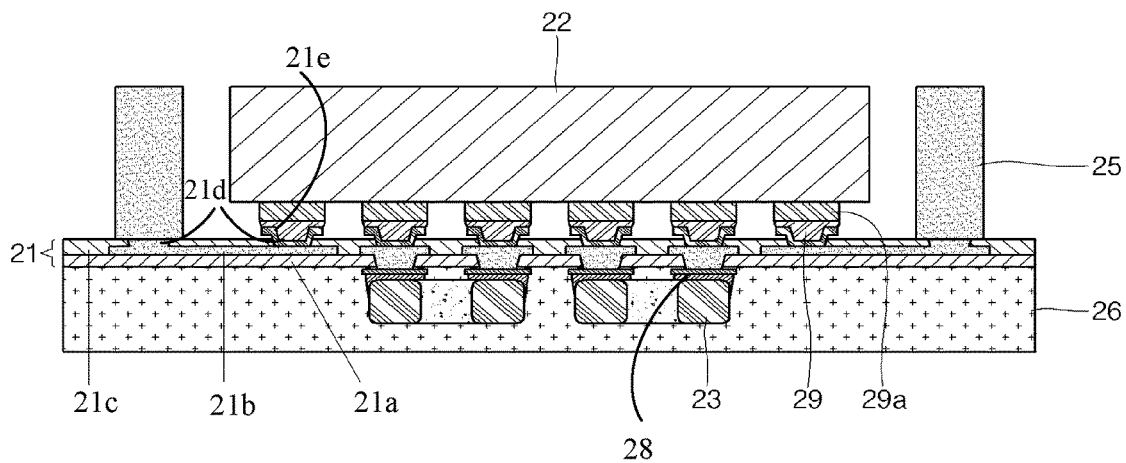

Referring next to FIG. 1 and the example structure 200f of FIG. 2F, the example method 100 may, at block 160, comprise forming one or more conductive pillars (or posts) on the signal distribution structure, and coupling one or more second electronic components (e.g., semiconductor dies, etc.) to the signal distribution structure (e.g., as formed at block 150, etc.).

Block 160 may, for example, comprise forming one or more conductive pillars 25 on the signal distribution structure 21. A conductive pillar 25 may, for example, be formed on a respective portion of the second conductive layer 21d and/or at least partially on the second dielectric layer 21c. The conductive pillar 25 may also be formed on a respective UBM structure 21e, if present. In an example implementation, block 160 may comprise forming the conductive pillar 25 to extend vertically from the signal distribution structure 21 (e.g., from a respective UBM structure 21e, from a respective pad or land or trace of the second conductive layer 21d, etc.). Such forming may be performed in any of a variety of manners, non-limiting examples of which are provided herein.

As discussed herein, the second conductive layer 21d may, for example, comprise any of a variety of conductive materials (e.g., copper, aluminum, silver, gold, nickel, alloys thereof, etc.). The second conductive layer 21d may, for example, be exposed through an aperture in the second dielectric layer 21d or another dielectric layer. The second dielectric layer 21c may, for example, cover side surfaces of the second conductive layer 21d (or pad or land thereof) and/or an outer perimeter of the top surface of the second conductive layer 21d. The second dielectric layer 21c may also, for example, leave at least portions of lateral side surfaces of the second conductive layer 21d exposed.

The conductive pillar 25 (or plurality thereof) may comprise any of a variety of characteristics. For example, the conductive pillar 25 may be cylinder-shaped, elliptical cylinder-shaped, rectangular post-shaped, etc. The conductive pillar 25 may, for example, comprise a flat upper end, a concave upper end, or a convex upper end. The conductive pillar 25 may, for example, comprise any of the materials discussed herein with regard to the conductive layers. In an example implementation, the conductive pillar 25 may comprise copper (e.g., pure copper, copper with some impurities, etc.), a copper alloy, etc. In an example implementation, block 160 (or another block of the example method 100) may also comprise forming a solder cap (or dome) on the conductive pillar 25.

Block 160 may comprise forming the conductive pillar 25 in any of a variety of manners (e.g., electroplating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto. Note that the conductive pillar 25 may also be formed by attaching a preformed wire (e.g., a die bonding wire, etc.), by filling in a via or trench in a temporary or permanent mask (e.g., a photoresist mask, a mold material mask, etc.), etc.

After forming the conductive pillar 25, block 160 may comprise stripping or removing the mask (e.g., chemical stripping, ashing, etc.), if a mask is utilized. Additionally, block 160 may comprise removing at least a portion of a seed layer if utilized to form the conductive pillar 25 (e.g., by chemically etching, etc.). Note that during the etching of the seed layer, a lateral edge portion of at least the seed layer under other non-etched layers may, for example, be etched. Such etching may, for example, result in an undercut beneath the remaining non-etched layers (e.g., the conductive pillar 25, the UBM structure 26e, etc.). For example, in an example implementation in which a UBM structure 26e and a respective conductive pillar 25 are both formed over a same seed layer, the etching of such seed layer may result in an undercut beneath the UBM structure 26e and/or beneath the conductive pillar 25 formed thereon. Also for example, in an example implementation in which a conductive pillar 25 is formed over a seed layer, the etching of such seed layer may result in an undercut beneath the conductive pillar 25.

After forming the conductive pillar 25, block 160 may, for example, comprise attaching (or coupling or forming) one or more second electronic components 22 to the signal distribution structure 21. The second electronic components 22 may, for example, comprise any or all of the types of components discussed herein with regard to the first electronic components 23. For example, an example implementation, the first electronic components 23 may comprise passive electronic devices, and the second electronic components 22 may comprise semiconductor dies. In another example implementation, the first electric components 23 may comprise semiconductor dies, and the second electronic components 22 may comprise semiconductor dies. In still another example implementation, the first electronic components 23 may comprise semiconductor dies, and the second electronic components 22 may comprise passive electronic devices. In yet another example implementation, the first electronic components 23 may comprise both semiconductor dies and passive components, and the second electronic components 22 may comprise both semiconductor dies and passive components.

Block 160 may, for example, comprise attaching a second electronic component 22 to a top side (or portion) of the signal distribution structure 21. In an example scenario in which the second electronic component 22 comprises a semiconductor die, the second electronic component 22 may, for example, be oriented in a manner in which an active side of the die (e.g., on which semiconductor circuitry is generally formed) faces the signal distribution structure 21 (e.g., in a flip-chip configuration, etc.) and an inactive side of the die opposite the active side of the die faces away from the signal distribution structure 21. Note that the active side of such semiconductor die may comprise die bond pads electrically connected to semiconductor circuitry of the die. For example, as illustrated in FIG. 2F, the bond pads 29/29a (and/or other interconnection terminals of the second electronic component 22 at the lower side of the second electronic component 22) may be attached to corresponding UBM structures 26e (if present) and/or exposed portions of the second conductive layer 26d of the signal distribution structure 21 (e.g., pads, lands, etc.). Such attachment (or connection) may, for example, be performed with conductive bumps 29/29a (e.g., C4 bumps, microbumps, metal pillars, conductive balls, etc.). Block 160 may comprise attaching the second electronic components 22 to the top side of the signal distribution structure 21 in any of a variety of manners (e.g., mass reflow, thermocompression bonding, direct metal-to-metal intermetallic bonding, laser soldering, conductive epoxy bonding, conductive film bonding, etc.). Note that the signal distribution structure 21 may electrically connect the conductive pillar(s) 25 to pads or terminals of the first electronic component(s) 23 and/or the second electronic component(s) 22.

The second electronic components 22 may be positioned on the signal distribution structure 21 in any of a variety of manners. For example, a second electronic component 22 may be centered on the signal distribution structure 21, but may also be laterally offset. Also for example, a plurality of the second electronic components 22 (as with the first electronic components 23) may be attached to the signal distribution structure 21 to be included in a same packaged semiconductor device.

The conductive pillars 25 (or posts) and the second electronic components 22 may be arranged in any of a variety of manners. For example, a second electronic component 22 (or a plurality thereof) may be laterally surrounded by a plurality of the conductive pillars 25 (e.g., surrounded on two, three, or four sides). In another example implementation, one or more conductive pillars 25 may be positioned laterally between second electronic components 22 of a same packaged semiconductor device.

Note that the second electronic component 22, for example when attached to the signal distribution structure 21, may be taller than the conductive pillar 25, shorter than the conductive pillar 25 or generally the same height as the conductive pillar 25. As discussed herein, the tops of the second electronic component 22, the conductive pillar 25, and/or the second encapsulating material 27 may be planarized in any of a variety of manners.

In general, block 160 may comprise forming one or more conductive pillars (or posts) and/or forming one or more second electronic components on the signal distribution structure. Accordingly, the scope of the present disclosure should not be limited by characteristics of any particular conductive pillar(s) or manner(s) of forming such pillars, or by characteristics of any particular electronic component(s) or manner(s) of forming (or attaching) such electronic components.

Figure 2G:
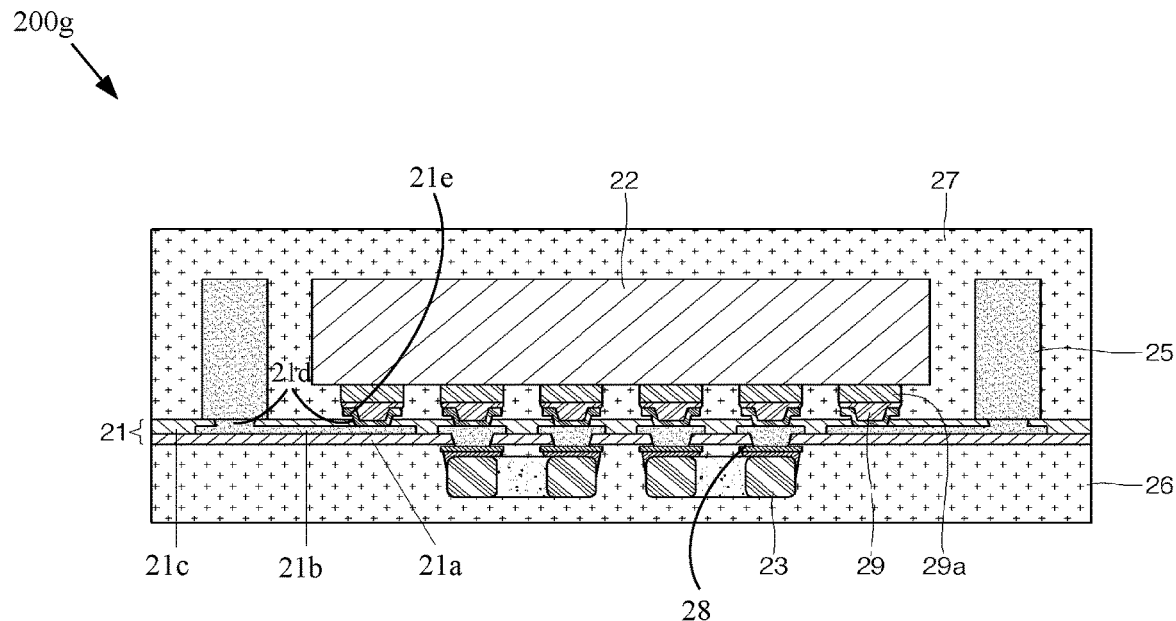

Referring next to FIG. 1 and the example structure 200g of FIG. 2G, the example method 100 may, at block 170, comprise forming a second encapsulating material. Block 170 may, for example, share any or all characteristics with block 130.

For example, block 170 may comprise covering the top side of the signal distribution structure 21, any or all sides of the conductive pillars 25 (e.g., top sides, lateral sides, bottom sides exposed by undercutting, etc.), any or all sides of the second electronic components 22 (e.g., top sides, bottom sides facing the signal distribution structure 21 where there is a gap between the component and the signal distribution structure 21, lateral sides, etc.) in a second encapsulating material 27. Additionally, the second encapsulating material 27 may cover any portion of bond pads or bumps of the second electronic components 22 that are not already covered. Note that any of the sides of one or more of the second electronic components 22 may be left uncovered by the second encapsulating material 27.

In an example implementation, the second encapsulating material 27 may cover a top side of the signal distribution structure 21 (e.g. any dielectric and/or conductive layer that is exposed at the top side of the signal distribution structure 21). The second encapsulating material 27 may also cover, in-whole or in-part, the lateral sides of the second electronic component 22 (or plurality thereof) and/or the lateral sides of the conductive pillar 25 (or plurality thereof). The second encapsulating material 27 may be formed to also cover the top sides of the second electronic component(s) 22 and/or of the conductive pillar(s) 25. Though FIG. 2G and other drawings herein show the second encapsulating material 27 only covering the top side of the signal distribution structure 21, it should be understood that the second encapsulating material 27 may also be formed to cover lateral sides of the signal distribution structure 21 and/or of the first encapsulating material 26 (e.g., following separation of the electronic device from a wafer or panel or other set of such electronic devices).

Note that the second encapsulating material 27 may also underfill the second electronic component 22, and/or an underfill separate from the second encapsulating material 27 may be applied during and/or after the attaching of the second electronic component 22. For example, such underfill may comprise any of a variety of types of material, for example, an epoxy, a thermoplastic material, a thermally curable material, polyimide, polyurethane, a polymeric material, filled epoxy, a filled thermoplastic material, a filled thermally curable material, filled polyimide, filled polyurethane, a filled polymeric material, a fluxing underfill, and equivalents thereof, but not limited thereto. Such underfilling may be performed utilizing a capillary underfill process, utilizing a pre-applied underfill, etc. For example, any electronic component discussed herein may be similarly underfilled.

Block 170 may comprise forming the second encapsulating material 27 in any of a variety of manners, non-limiting examples of which are provided herein. For example, block 270 may comprise forming the second encapsulating material 27 utilizing one or more of compression molding, transfer molding, liquid encapsulant molding, vacuum lamination, paste printing, film assisted molding, etc. Also for example, block 170 may comprise forming the second encapsulating material 27 utilizing one or more of spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.

The second encapsulating material 27 may comprise one or more of a variety of encapsulating materials, non-limiting examples of which are provided herein. For example, the second encapsulating material 27 may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). Also for example, the second encapsulating material 27 may comprise any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.).

The second encapsulating material 27 (or the forming thereof) may share any or all characteristics with the first encapsulating material 26. The scope of this disclosure, however, is not so limited. For example, block 170 may comprise forming the second encapsulating material 27 in a manner different from the manner in which block 130 forms the first encapsulating material 26. Also for example, the second encapsulating material 27 may be a different type of material than the first encapsulating material 26.

Figure 2H:
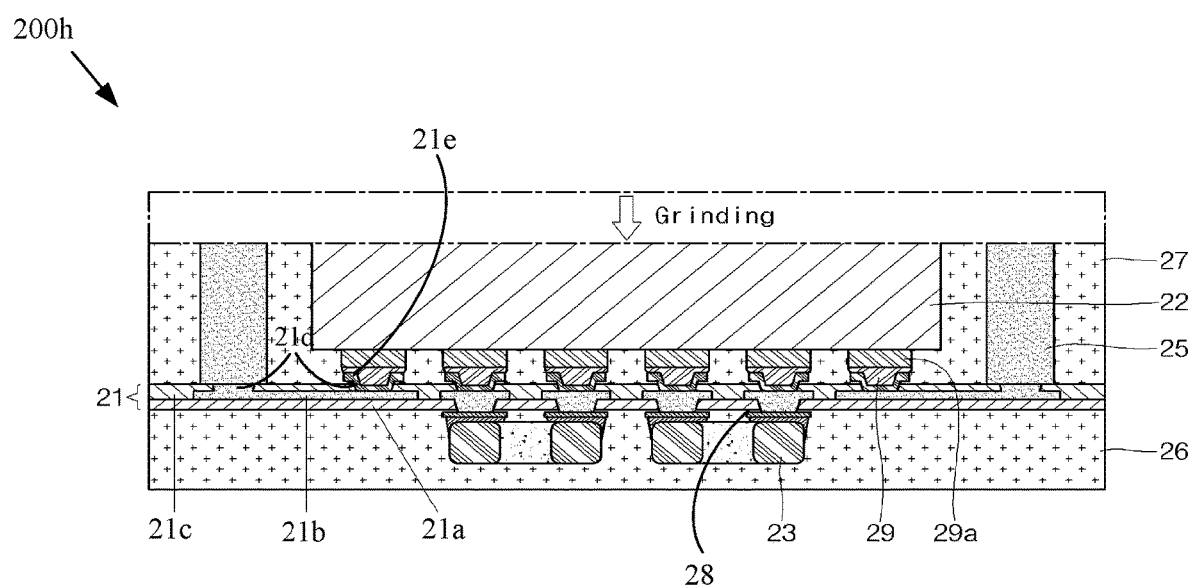

Referring next to FIG. 1 and the example structure 200h of FIG. 2H, the example method 100 may, at block 180, comprise thinning (or planarizing) the assembly as encapsulated at block 170.

For example, block 180 may comprise thinning or planarizing (e.g., mechanically grinding, chemically etching, shaving or shearing, peeling, any combination thereof, etc.) a top side of the second encapsulating material 27 to a desired thickness. Block 180 may also, for example, comprise thinning (e.g., mechanically grinding, chemically etching, shaving, peeling, any combination thereof, etc.) the second electronic component 22 (or plurality thereof) and/or the conductive pillar 25 (or plurality thereof). In the example implementation shown in FIG. 2H, block 180 comprises performing the thinning in a manner that results in coplanar top surfaces of the second encapsulating material 27, the second electronic component(s) 22, and/or the conductive pillar(s) 25. Thus, at least respective top surfaces (and/or at least an upper portion of lateral side surfaces) of the second electronic component(s) 22 and the conductive pillar(s) 25, are exposed from (or at) the top surface of the second encapsulating material 27. Note that while the example implementation shows the top side of the second electronic component(s) 22 exposed from the second encapsulating material 27, such exposure is not required. For example, in various implementations, a thin layer of the second encapsulating material 27 covering the top side of the second electronic component 22 may remain.

In various example implementations, blocks 110-180 (and/or the resulting structure) may share any or all characteristics with generally analogous blocks (and/or the resulting structures) shown in U.S. patent application Ser. No. 14/823,689, filed on Aug. 11, 2016, and titled "Semiconductor Package and Fabricating Method Thereof," the entirety of which is hereby incorporated herein by reference in its entirety for all purposes.

Figure 2I:
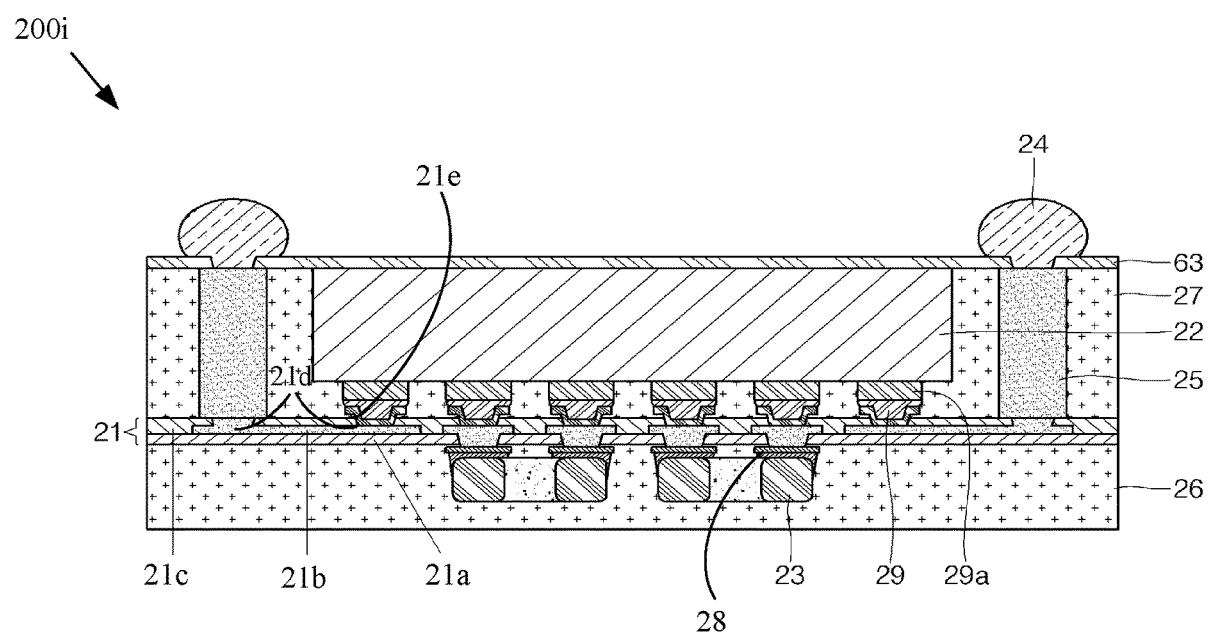

Referring next to FIG. 1 and the example structure 200i of FIG. 2I, the example method 100 may, at block 190, comprise forming a second signal distribution structure and interconnection structures. Block 190 may comprise performing such operations in any of a variety of manners, non-limiting examples of which are provided herein.

Block 190 may, for example, share any or all characteristics with block 150. In the example implementation 200i shown in FIG. 2I, block 190 comprises forming a dielectric layer 63 on second encapsulating material 27, conductive pillar(s) 25, and/or second electronic component(s) 22. The dielectric layer 63 (and the forming thereof) may, for example, share any or all characteristics with any dielectric layer discussed herein (and the forming thereof), including the forming of apertures.

The example dielectric layer 63 is shown with apertures exposing at least a central region of top ends of the conductive pillars 25. Block 190 may, for example, comprise forming such apertures in any of a variety of manners, various examples of which are provided herein (e.g., in the discussion of block 150).

Block 190 may, for example, comprise forming the interconnection structures 24 on top ends of the conductive pillars 25 (e.g., through respective apertures through the dielectric layer 63) and/or on portions of the dielectric layer 63 (e.g., surrounding the respective apertures through the dielectric layer 63).

The interconnection structures 24 may comprise any of a variety of characteristics. For example, an interconnection structure 24 may comprise a conductive ball or bump (e.g., a solder ball or bump, wafer bump, a solid core or copper core solder ball, etc.). For example, in an example implementation including a solder ball or bump, such balls or bumps may comprise tin, silver, lead, Sn—Pb, $Sn_{37}$—Pb, $Sn_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, combinations thereof, equivalents thereof, etc., but the scope of this disclosures is not limited thereto. An interconnection structure 24 may also comprise a conductive pillar or post, a wire, a land, etc., which may for example comprise any of the conductive materials (e.g., metals, conductive adhesives, etc.) discussed herein.

The interconnection structures 24 may be configured in any or a variety of configurations. For example, the interconnection structures 24 may be configured in a ball grid array configuration, a land grid array configuration, etc. The interconnection structures 24 may, for example, be arranged around a perimeter around the semiconductor package (e.g., surrounding a footprint (or outline) of the second electronic component(s) 22 and/or first electronic component(s) 23). The interconnection structure 24 may also, for example, be arranged in a row/column matrix array (e.g., where at least a portion of the matrix/array is within the footprint (or outline) of the second electronic component(s) 22 and/or the first electronic component(s) 23).

Block 190 may comprise forming (or attaching) such interconnection structures 24 in any of a variety of manners, non-limiting examples of which are provided herein. For example, block 190 may comprise forming (or attaching) such interconnection structures 24 by ball-dropping, bumping, metal-plating, pasting and reflowing, etc. For example, block 190 may comprise dropping a conductive ball on the end of the conductive pillar 25 (or exposed conductor or pad or land or UBM structure of the second signal distribution structure).

Though not shown, block 190 may also, for example, comprise forming (or attaching) additional components (e.g., passive components, active components, etc.) laterally between the interconnection structures 24. In an example implementation, such components may have a smaller height than the interconnection structures 24. For example, such components may have a smaller height than a solder ball conductive interconnection structure 24, a smaller height than a solid core (e.g., a copper core, etc.) of a solder ball interconnection structure 24, etc. In such an implementation, the interconnection structures 24 may provide a standoff to maintain space for such components when the interconnection structures 24 are attached to another substrate or component.

Referring next to FIG. 1 and the example structure 200i of FIG. 2I, the example method 100 may, at block 195, comprise singulating an electronic package from a wafer or panel or otherwise connected plurality of electronic packages. Block 195 may comprise performing such singulating in any of a variety of manners, non-limiting examples of which are provided herein.

For example, any or all of the blocks of the example method 100 may be performed at a wafer or panel level, for example forming a plurality of semiconductor devices (or packages) at the same time. The wafer or panel may then, for example, be singulated into individual packages. Such singulating may, for example, be performed by any one or more of mechanical cutting (e.g., sawing, cutting, abrading, snapping, etc.), energy cutting (e.g., laser cutting, plasma cutting, etc.), chemical cutting (e.g., etching, dissolving, etc.), etc. In an example implementation, such singulating may form coplanar lateral side surfaces of the semiconductor device (or package). For example, one or more of the lateral side surfaces of the first encapsulating material 26, the first signal distribution structure 21, the second encapsulating material 27, and the second signal distribution structure 25 may be coplanar on one or more lateral sides of the singulated semiconductor device (or package).

Figure 3A:
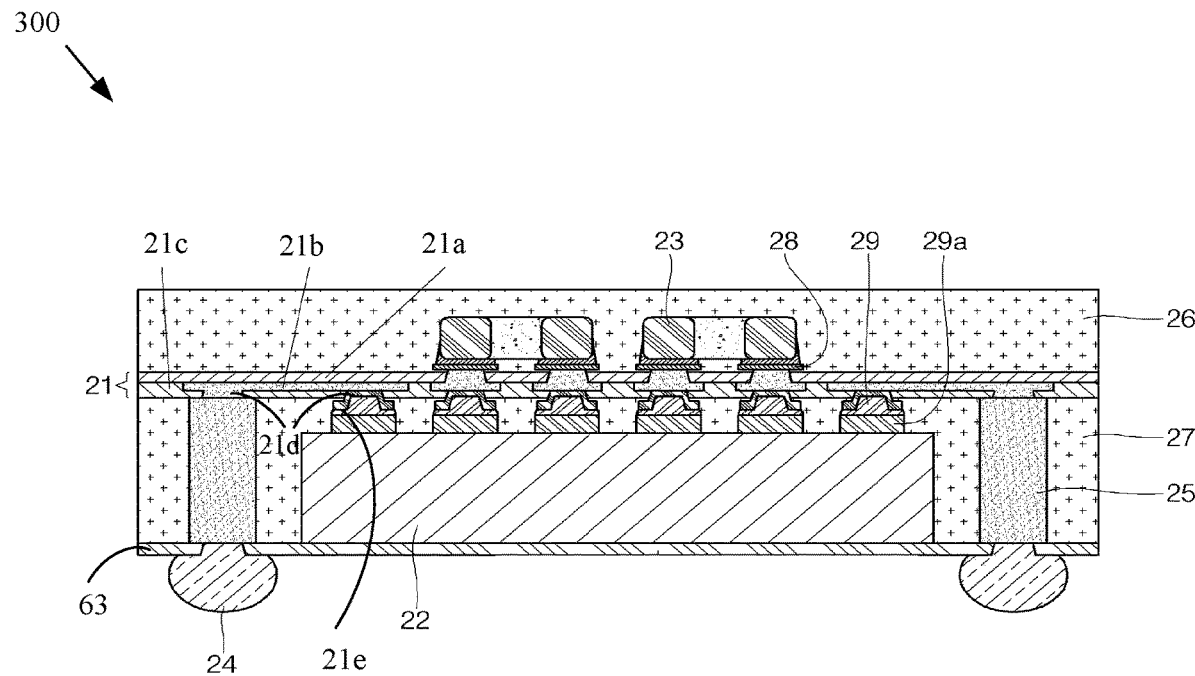
FIG. 3A shows a cross-sectional view of an example semiconductor device, in accordance with various aspects of the present disclosure.
Figure 3B:
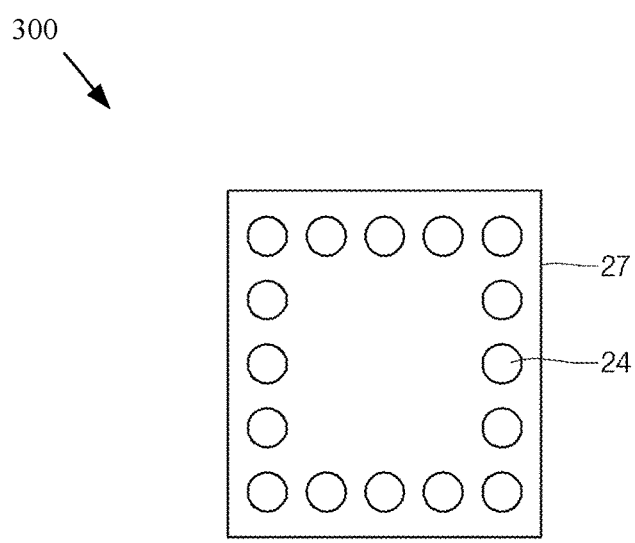
FIG. 3B shows a bottom view of an example semiconductor device, in accordance with various aspects of the present disclosure.

FIG. 3A shows a cross-sectional view of an example semiconductor device 300, in accordance with various aspects of the present disclosure, and FIG. 3B shows a bottom view of the example semiconductor device 300, in accordance with various aspects of the present disclosure. The example semiconductor device 300 shown in FIGS. 3A and 3B may result from implementing the example method 100 of FIG. 1, for example as illustrated in FIGS. 2A-2I and discussed herein.

For example, the example semiconductor device 300 (or package) may share any or all characteristics with the resulting semiconductor device 200i shown in FIG. 2I. Note that other method steps may be performed on the example package 300, for example adding or removing components, etc., without departed from the scope of this disclosure. Note that the example semiconductor device 300 (or any device discussed herein) may be referred to as a semiconductor package, an electronic device, an electronic package, a device, a package, etc.

As discussed herein, for example in the discussion of block 190 of the example method 100, the conductive pillars 25 and/or interconnection structures 24 coupled thereto may be arranged in any of a variety of manners. In an example implementation, as shown in FIGS. 3A and 3B, the conductive pillars 25 and interconnection structures 24 may be arranged around a perimeter of the footprint (or outline) of the second electronic component 22. For example, in such an example configuration, there might be no fan-in of the interconnection structures 24 to locations within the footprint (or outline) of the second electronic component 22. For example, as seen in FIGS. 3A and 3B, there are no interconnection structures 24 directly below the second electronic component 22.

As discussed herein however (e.g., in the discussion of block 190 of the example method 100), the second signal distribution structure (shown in FIGS. 2I and 3A as a dielectric layer 63 with apertures filled with conductive material) may comprise any number of dielectric and/or conductive layers. For example, the second signal distribution structure may share any or all characteristics with the signal distribution structure 21 formed at block 150.

Figure 4A:
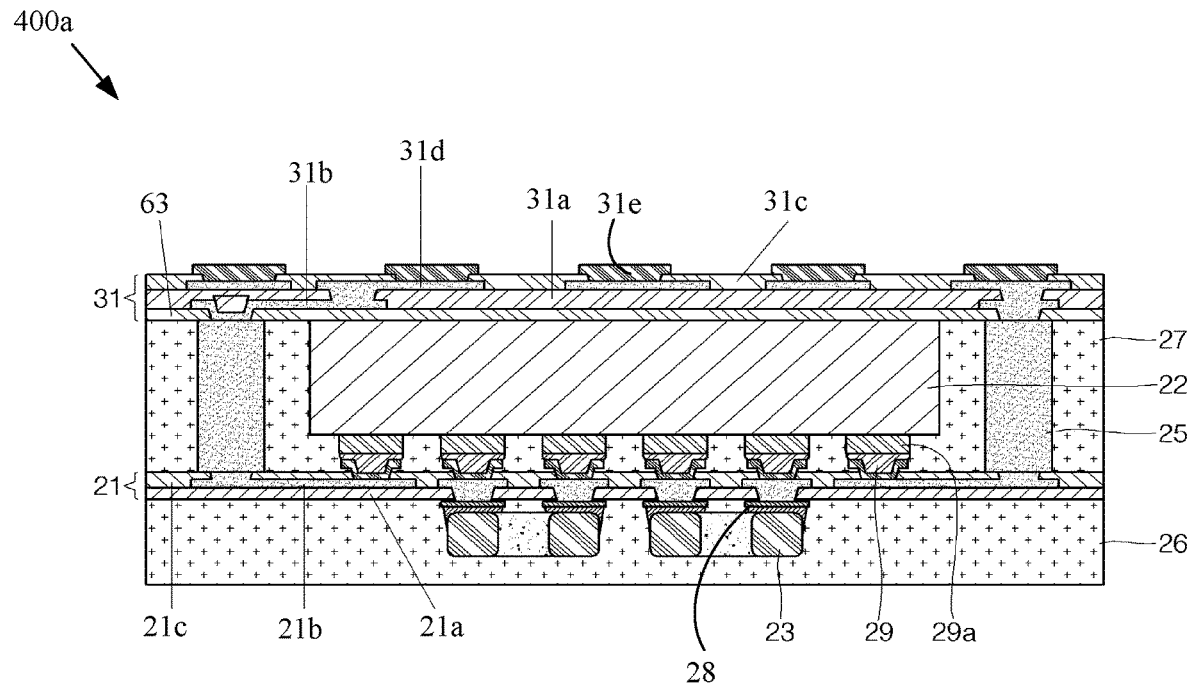
FIGS. 4A-4B show cross-sectional views illustrating various steps of an example method of manufacturing a semiconductor device, in accordance with various aspects of the present disclosure.

For example, referring next to FIG. 1 and the example structure 400a of FIG. 4a, the example method 100 may, at block 190, comprise forming a second signal distribution structure 31. The second signal distribution structure 31 (and/or the forming thereof) may share any or all characteristics with the first signal distribution structure 21 (and/or the forming thereof). The example second signal distribution structure 31, for example, comprises a plurality of dielectric layers and a plurality of conductive layers (e.g., pad or land layers, trace layers, UBM layers, etc.).

For example, in addition to the dielectric layer 63, the second signal distribution structure 31 may comprise a first dielectric layer 31a, a first conductive layer 31b, a second dielectric layer 31c, a second conductive layer 32b, and a UBM structure 32e (or alternatively a pad). For example, the first conductive layer 31b may be connected to the conductive pillar 25 through an aperture in the dielectric layer 63. Then any number of conductive layers and dielectric layers may be formed to form the signal distribution structure 31. Such conductive layers (e.g., the first conductive layer 31b, the second conductive layer 31d, etc.) may distribute respective signals to/from the conductive pillars 25 from/to any locations on the footprint of the semiconductor device.

Figure 4B:
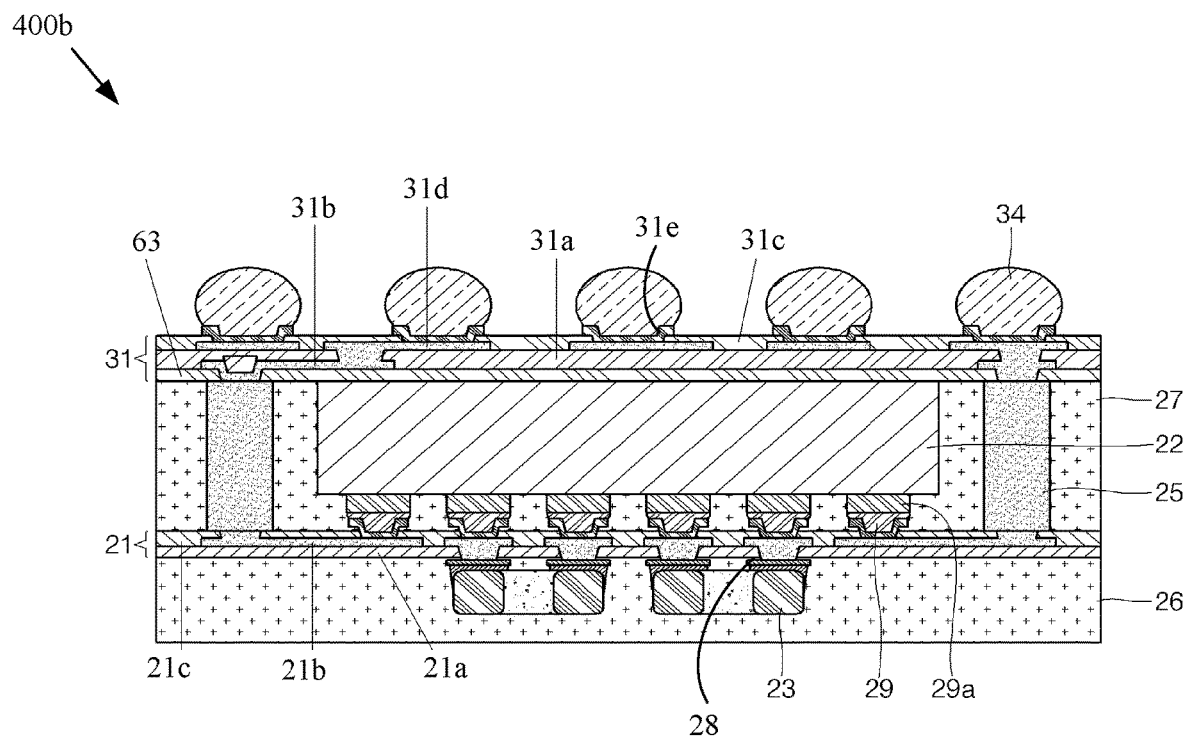

Also for example, referring next to FIG. 1 and the example structure 440b of FIG. 4B, the example method 100 may, at block 190, comprise forming interconnection structures 34 attached to the second signal distribution structure 31 (e.g., to pads, lands, UBM structures, etc.).

Figure 5A:
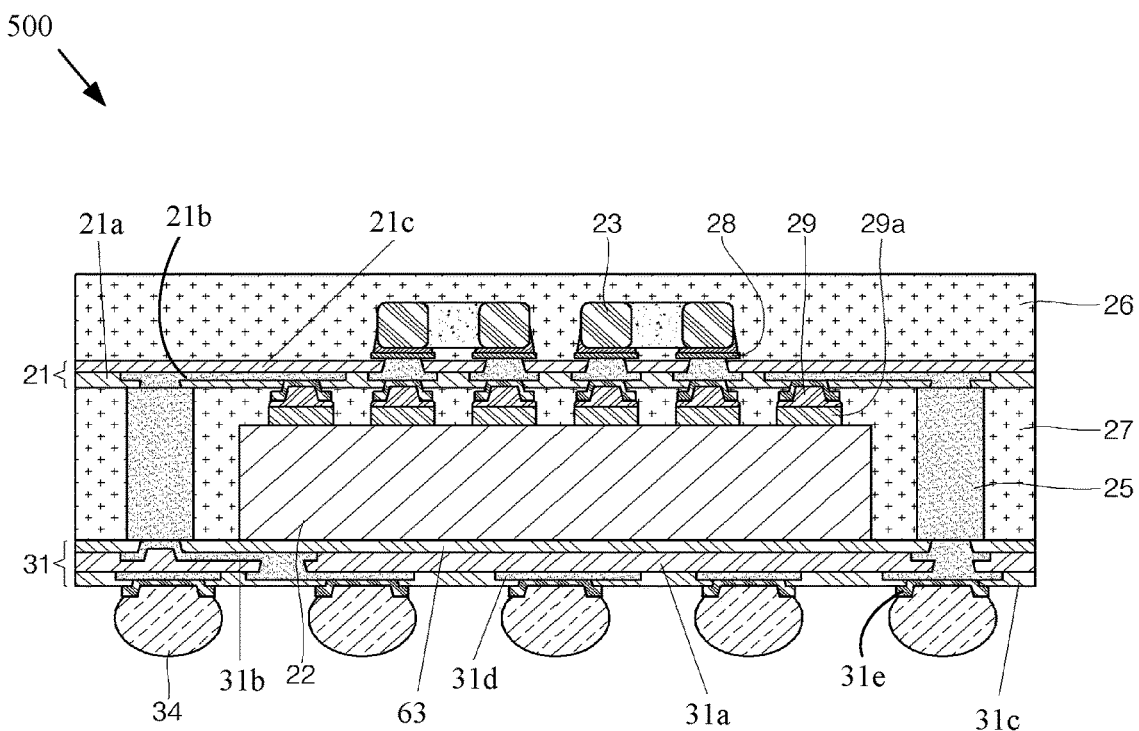
FIG. 5A shows a cross-sectional view of an example semiconductor device, in accordance with various aspects of the present disclosure.
Figure 5B:
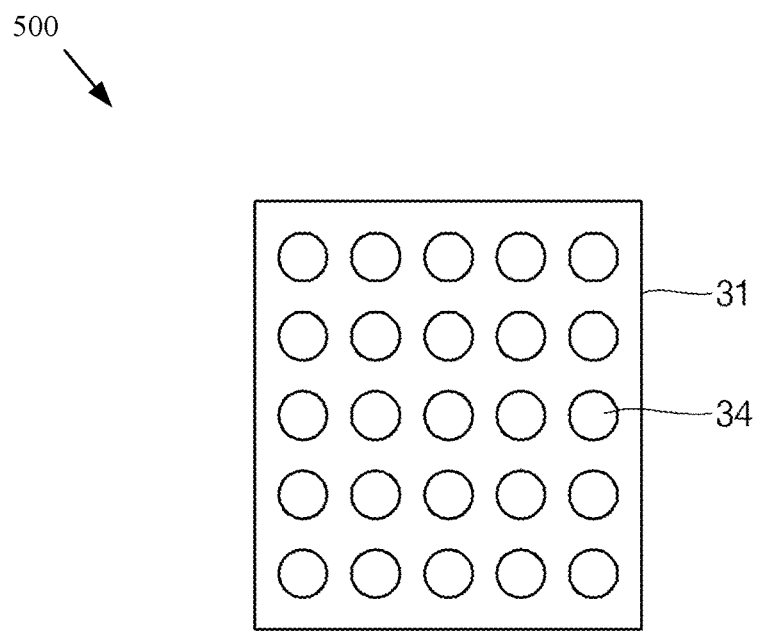
FIG. 5B shows a bottom view an example semiconductor device, in accordance with various aspects of the present disclosure.

FIG. 5A shows a cross-sectional view of an example semiconductor device 500, in accordance with various aspects of the present disclosure, and FIG. 5B shows a bottom view of the example semiconductor device 500, in accordance with various aspects of the present disclosure. The example semiconductor device 500 shown in FIGS. 5A and 5B may result from implementing the example method 100 of FIG. 1, for example as illustrated in FIGS. 2A-2I and in FIGS. 4A-4B, and discussed herein.

For example, the example semiconductor device 500 (or package) may share any or all characteristics with the resulting semiconductor device 400b shown in FIG. 4B and with resulting semiconductor device 200i shown in FIG. 2I. Note that other method steps may be performed on the example package 500, for example adding or removing components, etc., without departed from the scope of this disclosure. Note that the example semiconductor device 500 (or any device discussed herein) may be referred to as a semiconductor package, an electronic device, an electronic package, a device, a package, etc.

As discussed herein, for example in the discussion of block 190 of the example method 100, the conductive pillars 25 and/or interconnection structures 24 coupled thereto may be arranged in any of a variety of configurations. One such example, as shown in FIGS. 5A and 5B, the conductive pillars 25 may be arranged around a perimeter of the footprint (or outline) of the second electronic component 22. For example, in such an example configuration, there might be a full matrix of the interconnection structures 24, for example the second signal distribution structure 31 providing a fan-in to locations within the footprint (or outline) of the second electronic component 22. For example, as seen in FIG. 5B, some of the interconnection structures 34 are directly below the second electronic component 22, and some of the interconnection structures 34 are not directly below the second electronic component 22. For example, some of the interconnection structures 34 may be directly below respective conductive pillars 25, and some of the interconnection structures 34 may be laterally offset from respective conductive pillars 25.

In summary, various aspects of this disclosure provide a semiconductor device and a method of manufacturing a semiconductor device. As a non-limiting example, various aspects of this disclosure provide a semiconductor device comprising multiple encapsulating layers and multiple signal distribution structures, and a method of manufacturing thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope.

Therefore, it is intended that the disclosure not be limited to the particular example(s) disclosed, but that the disclosure will include all examples falling within the scope of the appended claims.

What is claimed is:

1. A semiconductor device comprising:
a first signal distribution structure (SDS) having a top SDS side, a bottom SDS side, and a plurality of lateral SDS sides, wherein the first SDS comprises a first dielectric layer and a first conductive layer;
a first electronic component coupled to the top SDS side and comprising a first contact;
a first encapsulating material that contacts at least a portion of the top SDS side and at least a portion of the first electronic component;
a semiconductor die comprising a top side coupled to the bottom SDS side and positioned directly below the first electronic component;
a plurality of conductive pillars coupled to the bottom SDS side and positioned laterally around the semiconductor die; and
a second encapsulating material that contacts at least a portion of the bottom SDS side, at least a portion of the semiconductor die, and at least a portion of the plurality of conductive pillars,
wherein:
the second encapsulating material laterally surrounds each of the conductive pillars and directly contacts conductive material of each conductive pillar of the plurality of conductive pillars;
a bottom side of each of the plurality of conductive pillars and a bottom side of the semiconductor die opposite the top side of the semiconductor die are exposed from the second encapsulating material at a bottom side of the second encapsulating material;
an entirety of an uppermost surface of each of the plurality of conductive pillars is exposed from the second encapsulating material and is not vertically higher than the second encapsulating material; and
the first conductive layer and the first contact are coupled together without use of solder.

2. The semiconductor device of claim 1, wherein:
the bottom side of each of the plurality of conductive pillars, the bottom side of the semiconductor die opposite the top side of the semiconductor die, and the bottom side of the second encapsulating material are coplanar; and
the bottom side of each of the plurality of conductive pillars, the bottom side of the semiconductor die opposite the top side of the semiconductor die, and the bottom side of the second encapsulating material comprises a respective grinded surface.

3. The semiconductor device of claim 1, wherein:
a top side of the first electronic component is covered;
a portion of a bottom side of the first electronic component is covered by the first encapsulating material;
a portion of the top side of the semiconductor die is covered by the second encapsulating material; and
the first signal distribution structure (SDS) comprises an under bump metal that is laterally surrounded by the second encapsulating material.

4. The semiconductor device of claim 1, comprising a second signal distribution structure (SDS) on the bottom side of the second encapsulating material, the second SDS comprising a second conductive layer comprising traces and a third conductive layer comprising lands.

5. The semiconductor device of claim 4, comprising a plurality of conductive balls coupled to the lands at a bottom side of the second SDS and positioned directly below the semiconductor die, and wherein the second SDS electrically connects each of the plurality of conductive balls to a respective one of the plurality of conductive pillars.

6. The semiconductor device of claim 4, wherein one of the lateral SDS sides is coplanar with a respective lateral side of the first encapsulating material, a respective lateral side of the second encapsulating material, and a respective lateral side of the second SDS.

7. The semiconductor device of claim 1, wherein:
the first conductive layer comprises a first seed layer directly on the first contact, and an electroplated metal layer directly on the first seed layer; and
the semiconductor die is soldered to the bottom SDS side.

8. The semiconductor device of claim 1, comprising:
a second electronic component coupled to the top SDS side and positioned directly above the semiconductor die;
a first conductive pathway from the first electronic component, through the first SDS, and to the semiconductor die; and
a second conductive pathway from the second electronic component, through the first SDS, and to the semiconductor die,
wherein each of the first and second electronic components comprises a semiconductor die.

9. The semiconductor device of claim 1, comprising an underbump metallization (UBM) structure on the bottom SDS side, wherein:
the semiconductor die is coupled to the UBM structure; and
the UBM structure comprises a lowest surface that is vertically lower than the respective uppermost surface of each of the conductive pillars.

10. The semiconductor device of claim 1, comprising:
a first metallization structure through which the semiconductor die is coupled to the bottom SDS side; and
a second metallization structure, different from the first metallization structure, through which a first conductive pillar of the plurality of conductive pillars is coupled to the bottom SDS side.

11. A semiconductor device comprising:
a first signal distribution structure (SDS) having a top SDS side, a bottom SDS side, and a plurality of lateral SDS sides, wherein the first SDS comprises a first dielectric layer and a first conductive layer;
a first electronic component coupled to the top SDS side and comprising a first contact;
a first encapsulating material that contacts at least a portion of the top SDS side and at least a portion of the first electronic component;
a semiconductor die comprising a bottom die side and a top die side positioned directly below the first electronic component;
a plurality of conductive structures that couple the top die side to the bottom SDS side;
a plurality of conductive pillars coupled to the bottom SDS side and positioned laterally around the semiconductor die;
a second encapsulating material that directly contacts at least a portion of the bottom SDS side, at least a portion of the semiconductor die, at least a portion of the plurality of conductive structures, and at least a portion of the plurality of conductive pillars;

a lower dielectric layer comprising a top side and a bottom side, wherein a bottom side of the second encapsulating material is on the top side of the lower dielectric layer, wherein the lower dielectric layer comprises a plurality of apertures, and wherein each aperture extends from the top side of the lower dielectric layer to the bottom side of the dielectric layer exposing a lowermost surface of a respective one of the plurality of conductive pillars through the lower dielectric layer; and a plurality of interconnection structures, wherein each interconnection structure comprises a conductive ball, and wherein each interconnection structure is coupled to the lowermost surface of a respective one of the plurality of conductive pillars via a respective one of the plurality of apertures; and wherein:
the second encapsulating material directly contacts and laterally surrounds each of the conductive pillars;
a bottom side of each of the plurality of conductive pillars and the bottom die side are exposed from the second encapsulating material at a bottom side of the second encapsulating material;
an entirety of an uppermost surface of each of the plurality of conductive pillars is exposed from the second encapsulating material and is not vertically higher than the second encapsulating material;
a first portion of said entirety of the uppermost surface of each of the plurality of conductive pillars is contacted by the first dielectric layer of the first SDS; and
a second portion of said entirety of the uppermost surface of each of the plurality of conductive pillars is contacted by the first conductive layer of the first SDS.

12. The semiconductor device of claim 11, comprising:
a plurality of conductive balls;
wherein each conductive ball of the plurality of conductive balls is coupled to the lowermost surface of a respective one of the plurality of conductive pillars; and
wherein the plurality of conductive balls are arranged around a perimeter of a footprint of the semiconductor device such that no conductive balls are within the footprint of the semiconductor device.

13. The semiconductor device of claim 11, wherein the bottom die side directly contacts the top side of the lower dielectric layer.

14. The semiconductor device of claim 11, wherein the bottom die side is coplanar with the bottom side of the second encapsulating material.

15. A semiconductor device comprising:
a first signal distribution structure (SDS) having a top first SDS side, a bottom first SDS side, and a plurality of lateral first SDS sides that extend between the top first SDS side and the bottom first SDS side, wherein the first SDS comprises a first conductive layer and a first dielectric layer, wherein the first conductive layer comprises a first conductive via having a top first via side and a bottom first via side, wherein the bottom first SDS side comprises a plurality of under bump metallization (UBM) structures, and wherein the plurality of UBM structures comprises a first UBM structure having a top first UBM structure side that directly contacts the bottom first via side;
a first electronic component coupled to the top first SDS side, wherein the first electronic component comprises a first conductive terminal comprising a bottom first conductive terminal side that directly contacts the top first via side;
a first encapsulating material that contacts at least a portion of the top first SDS side and at least a portion of the first electronic component;
a second electronic component comprising a top side coupled to the UBM structures of the bottom first SDS side such that a first pad at the top side of the second electronic component that directly contacts a bottom first UBM structure side of the first UBM structure and the second electronic component is positioned below the first electronic component;
a plurality of conductive pillars coupled to the bottom first SDS side;
a second encapsulating material that directly contacts at least a portion of the bottom first SDS side, at least a portion of the second electronic component, and at least a portion of the conductive pillars; and
a second signal distribution structure (SDS) having a top second SDS side coupled to the conductive pillars, a bottom second SDS side, and a plurality of lateral second SDS sides that extend between the top second SDS side and the bottom second SDS side,
wherein:
each of the conductive pillars comprises an uppermost planar surface of metal that is directly contacted by the first dielectric layer of the first SDS and is directly contacted by the first conductive layer of the first SDS;
the second signal distribution structure (SDS) comprises a second conductive layer and a second dielectric layer; and
each of the conductive pillars comprises a lowermost planar surface of metal that is directly contacted by the second dielectric layer of the second SDS and is directly contacted by the second conductive layer of the second SDS.

16. The semiconductor device of claim 15, wherein the first conductive layer and the first electronic component are electrically coupled together without use of solder.

17. The semiconductor device of claim 15, wherein:
a portion of a top side of the second electronic component is covered by the second encapsulating material; and
the second encapsulating material directly contacts a lateral side of the first UBM structure.

18. The semiconductor device of claim 15, comprising a plurality of conductive balls coupled to the bottom second SDS side and positioned directly below the second electronic component, and wherein the second SDS electrically connects each of the plurality of conductive balls to a respective one of the conductive pillars.

19. The semiconductor device of claim 15, wherein:
the first conductive layer and the first electronic component are electrically coupled together without use of solder; and
the top side of the second electronic component is soldered to the bottom first SDS side.

20. The semiconductor device of claim 15, the bottom first UBM structure side comprises a lowest surface that is vertically lower than the respective uppermost planar surface of each of the conductive pillars.

21. The semiconductor device of claim 15, wherein each of the first SDS and second SDS comprises a plurality of conductive layers and a plurality of dielectric layers.

22. The semiconductor device of claim 15, wherein a bottom side of the second electronic component directly contacts the top second SDS side.

23. The semiconductor device of claim 15, wherein a bottom side of the second electronic component is coplanar with a bottom side of the second encapsulating material.

24. A method of manufacturing a semiconductor device, the method comprising:
   providing a first signal distribution structure (SDS) having a top SDS side, a bottom SDS side, and a plurality of lateral SDS sides, wherein the first SDS comprises a first dielectric layer and a first conductive layer;
   providing a first electronic component coupled to the top SDS side and comprising a first contact;
   providing a first encapsulating material that contacts at least a portion of the top SDS side and at least a portion of the first electronic component;
   providing a semiconductor die comprising a top side coupled to the bottom SDS side and positioned directly below the first electronic component;
   providing a plurality of conductive pillars coupled to the bottom SDS side and positioned laterally around the semiconductor die; and
   providing a second encapsulating material that contacts at least a portion of the bottom SDS side, at least a portion of the semiconductor die, and at least a portion of the plurality of conductive pillars,
   wherein:
      the second encapsulating material laterally surrounds each of the conductive pillars and directly contacts conductive material of each conductive pillar of the plurality of conductive pillars;
      a bottom side of each of the plurality of conductive pillars and a bottom side of the semiconductor die opposite the top side of the semiconductor die are exposed from the second encapsulating material at a bottom side of the second encapsulating material;
      an entirety of an uppermost surface of each of the plurality of conductive pillars is exposed from the second encapsulating material and is not vertically higher than the second encapsulating material; and
      the first conductive layer and the first contact are coupled together without use of solder.

25. The method of claim 24, comprising:
providing a lower dielectric layer on the bottom side of the second encapsulating material, wherein the lower dielectric layer comprises a plurality of apertures, each of the apertures exposing a respective one of the plurality of conductive pillars through the lower dielectric layer; and
wherein:
   a portion of said entirety of the uppermost surface of each of the plurality of conductive pillars is contacted by the first dielectric layer of the first SDS; and
   a second portion of said entirety of the uppermost surface of each of the plurality of conductive pillars is contacted by the first conductive layer of the first SDS.

26. The method of claim 24, wherein:
a top side of the first electronic component is covered;
a portion of a bottom side of the first electronic component is covered by the first encapsulating material;
a portion of the top side of the semiconductor die is covered by the second encapsulating material; and
the first signal distribution structure (SDS) comprises an under bump metal that is laterally surrounded by the first encapsulating material.

\* \* \* \* \*